United States Patent [19]
Zirngibl

[11] Patent Number: 5,444,725
[45] Date of Patent: Aug. 22, 1995

[54] MULTIFREQUENCY LASER
[75] Inventor: Martin Zirngibl, Middletown, N.J.
[73] Assignee: AT&T IPM Corp., Coral Gables, Fla.
[21] Appl. No.: 316,614
[22] Filed: Sep. 30, 1994
[51] Int. Cl.$^6$ .............................................. H01S 3/10
[52] U.S. Cl. ........................................ 372/20; 372/23; 372/28
[58] Field of Search ........................ 372/20, 23, 28, 50; 385/14, 17, 37

[56] References Cited

U.S. PATENT DOCUMENTS

| | | | |
|---|---|---|---|
| 4,904,042 | 2/1990 | Dragone | 350/96.16 |
| 5,002,350 | 3/1991 | Dragone | 350/96.15 |
| 5,136,671 | 8/1992 | Dragone | 385/46 |
| 5,179,605 | 1/1993 | Kaverhad et al. | 385/37 |
| 5,191,625 | 3/1993 | Gustavsson | 372/50 |
| 5,233,453 | 8/1993 | Sivarajan et al. | 385/14 |
| 5,243,672 | 9/1993 | Dragone | 385/46 |
| 5,373,516 | 12/1994 | Glance et al. | 372/20 |
| 5,373,517 | 12/1994 | Dragone et al. | 372/20 |

OTHER PUBLICATIONS

"Optimum design of a planar array of tapered waveguides", Optical Society of America, vol. 7, No. 11/Nov. 1990, pp. 2081–2093, C. Dragone.
"Polarisation Independent 8x8 Waveguide Grating Multiplexer On InP", Electronics Letters, Jan. 1, 1993, vol. 29, No. 2, pp. 201–202, M. Zirngibl, et al.
"12Frequency WDM Laser Based on a Transmissive Waveguide Grating Router" Electronics Letters, Apr. 28, 1994, vol. 30, No. 9, pp. 701–702, M. Zirngibl et al.
"Demonstration of a 15x15 Arrayed Waveguide Multiplexer on InP", IEEE Photonics Tech Ltrs., vol. 4, No. 11, Nov. 1992, pp. 1250–1253, M. Zirngibl, et al.

Primary Examiner—Rodney B. Bovernick
Assistant Examiner—Yisun Song
Attorney, Agent, or Firm—Gregory C. Ranieri

[57] ABSTRACT

A tunable laser capable of high speed operation is realized by modifying a tunable laser incorporating an N×N wavelength grating router to have an output waveguide positioned for capturing second order diffraction optical energy from the router free-space region. The second order diffraction-optical energy is supplied as the laser output at the desired wavelength to which the laser is tuned.

19 Claims, 4 Drawing Sheets

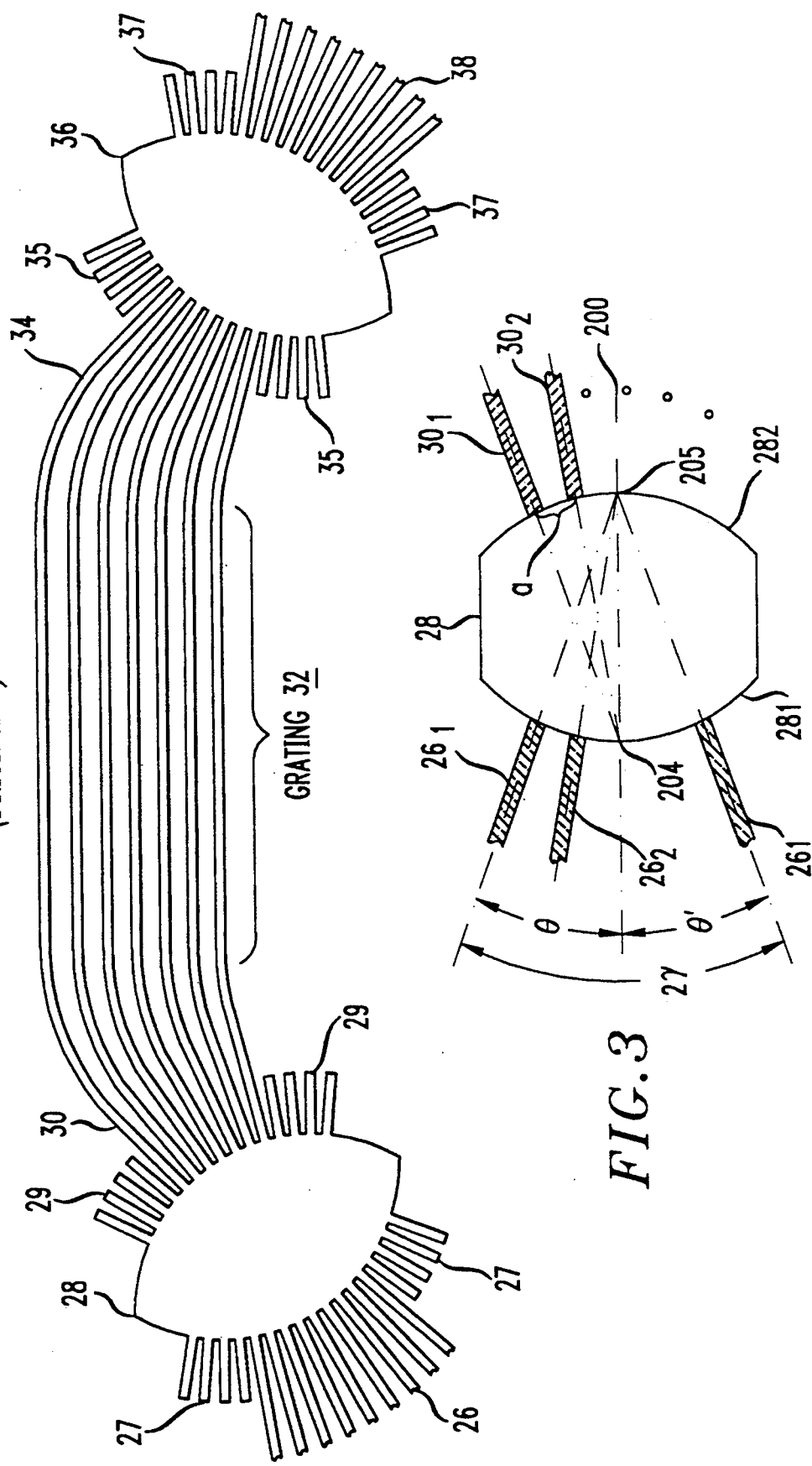

MULTIFREQUENCY LASER

TECHNICAL FIELD

This invention relates to integrated semiconductor lasers and, more particularly, to a laser which is tunable to a one or more of a plurality of selectable frequencies.

BACKGROUND OF THE INVENTION

High capacity lightwave transmission systems attempt to optimize bandwidth usage by employing wavelength division multiplexing. This is accomplished by using optical sources such as lasers, each designed to operate at a different wavelength (frequency) from the other lasers.

Recently, a number of designs have been proposed for tunable semiconductor lasers exhibiting a large number of available optical wavelengths. One such tunable laser is shown in U.S. Pat. No. 5,373,517 copending U.S. patent application Ser. No. 08/019,952 filed Feb. 19, 1992). This laser is fabricated with optical amplifiers, optical waveguides and an N×N waveguide grating router which are all integrated on a semiconductor wafer and disposed within a resonant optical cavity formed between two reflective end surfaces.

Waveguides formed in the semiconductor wafer carry light between the reflective end surfaces and the frequency router. The waveguides terminate on the input and output ports of the router at locations determined solely by first order diffraction within the free-space region of the router.

An addressable optical amplifier is formed in a portion of each input and output waveguide for the router. Each amplifier can be selectively addressed via a bias current to provide optical gain or optical loss. Amplification results within a particular waveguide when the amplifier is activated by a bias current. If the amplification provides sufficient optical gain to overcome intra-cavity losses, lasing is sustained at the wavelength determined by the path through the router. Moreover, selected amplifiers provide sufficient loss within their respective waveguides to prevent transmission of optical energy when no bias current or a low bias current is supplied to the amplifier.

In operation, this tunable laser is set to operate at a predetermined wavelength when a single pair of amplifiers is selected to operate in their separate amplification modes. This pair of amplifiers determines a particular path through the frequency router and, therefore, the wavelength of the light output. Light at the desired wavelength is extracted directly from the spot at which the particular path terminates on the reflective end surface. The laser is rapidly tunable to any of N wavelengths by selecting an appropriate pair of amplifiers.

While this laser has shown improved performance with respect to tuning speed, tuning range, and wavelength selectivity, its overall length is sufficiently long to prohibit high speed operation using direct modulation or an intra-cavity modulator. Modulation is limited to several hundred Mbps.

SUMMARY OF THE INVENTION

A tunable laser capable of high speed operation is realized by modifying the aforementioned tunable laser to incorporate an N×N wavelength grating router having an output waveguide positioned for capturing second order diffraction optical energy from a free-space region in the router. The second order diffraction optical energy is delivered to the laser output at the desired wavelength to which the laser is tuned.

Reflective surfaces of the laser can be modified to improve overall performance of the laser. In one embodiment of the tunable laser, highly reflective coatings are employed on the reflective surfaces at the terminus of all waveguides except the output waveguide. In another embodiment of the laser, an anti-reflective coating is utilized on the reflective surface at the remote end of the output waveguide.

An external modulator is integrated into the output waveguide of the tunable laser in another embodiment of the invention.

BRIEF DESCRIPTION OF THE DRAWINGS

A more complete understanding of the invention may be obtained by reading the following description of specific illustrative embodiments of the invention in conjunction with the appended drawing in which:

FIG. 2 shows a simplified diagram of the waveguides and free-space regions in a prior art waveguide grating router;

FIG. 3 shows a simplified diagram of a modified portion of the waveguide grating router having a secondary or output waveguide for capturing second order diffraction optical energy;

DETAILED DESCRIPTION

A brief description of the prior art tunable laser and waveguide grating router is being provided in order to develop a better understanding of the present invention and its departure from the prior art. It should be noted that the waveguide grating router has also been referenced by its inventors and others as a "frequency routing device." The latter term describes the action of light at different frequencies taking different paths through the router. In the description which follows, the terms "frequency" and "wavelength" may be used interchangeably when referring to the operation of the laser or its router.

Figure 1:
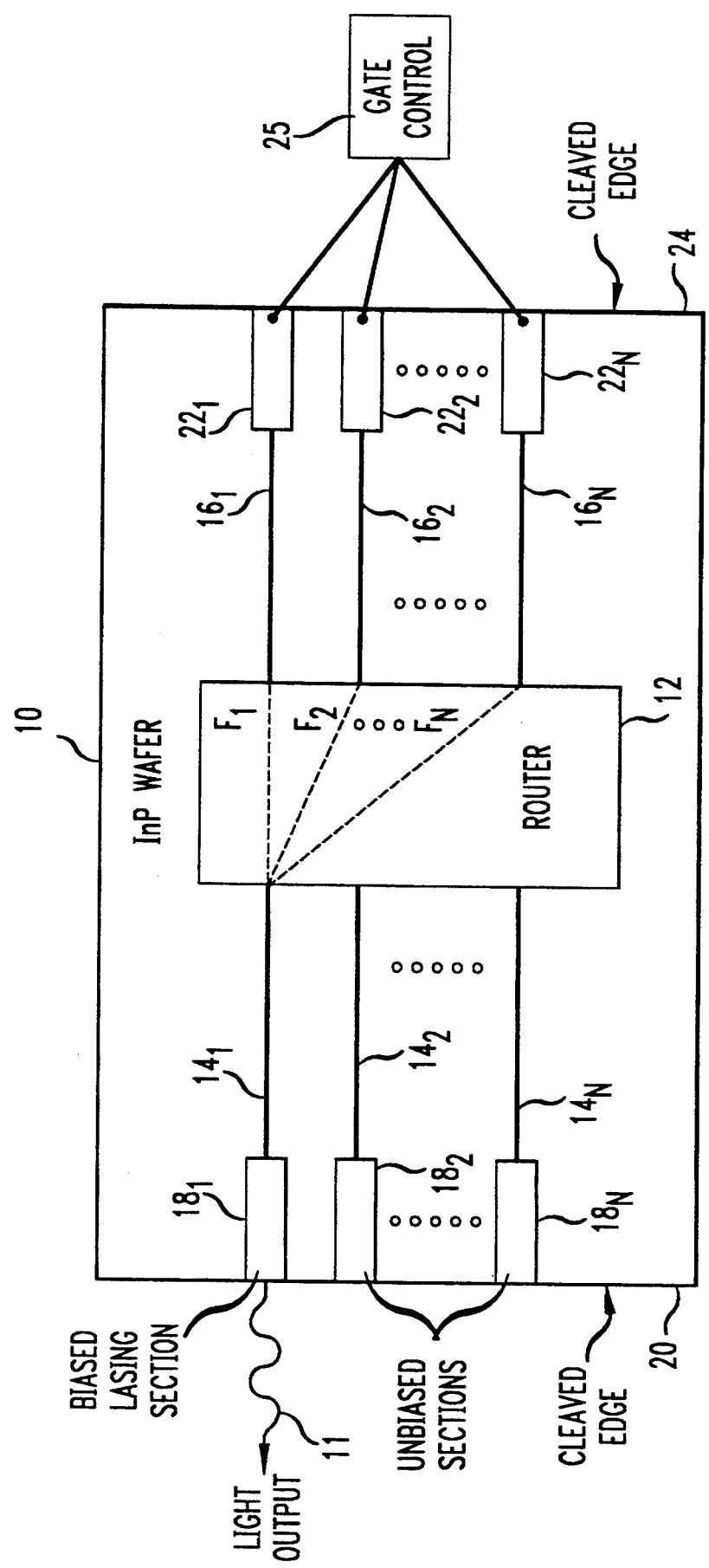
FIG. 1 shows a simplified schematic drawing of a prior art tunable laser incorporating a waveguide grating router.

FIG. 1 shows an example of a prior art laser which is rapidly tunable over a wide frequency range. The tunable laser comprises a waveguide grating router for providing frequency selectivity, a number of waveguides extending from the router for carrying optical signals to and from the router, and a number of active sections for providing optical amplification and sufficient gain for lasing behavior. Constituent elements of the laser shown in FIG. 1 may be monolithically integrated on a semiconductive wafer. These elements may be realized using known photolithographic and semiconductor growth techniques.

FIG. 1 shows an exemplary illustration of wafer 10 made of a semiconductive material such as a semiconductor compound from Group III–V. For example, the wafer and its grown regions can be realized primarily from layers of indium phosphide (InP) and an indium phosphide based material such as InGaAsP. Growth techniques such as MOCVD are contemplated for device fabrication.

As shown in FIG. 1, N×N waveguide grating router 12 is defined on wafer 10. A first plurality of waveguides $14_1$, $14_2$, ..., $14_N$ is connected to one end of waveguide grating router 12; a second plurality of waveguides $16_1$, $16_2$, ..., $16_N$ is connected to an opposite end of waveguide grating router 12. The waveguides are disposed at each end of the free space region at appropriate locations which correspond to only the presence of first order diffraction light energy from the waveguide grating. Waveguides 14 and 16 are realized in practice as buried rib waveguides.

In the embodiment shown in FIG. 1, a first plurality of optical amplifiers $18_1$, $18_2$, ..., $18_N$ connects corresponding ones of the first plurality of waveguides to cleaved face 20 formed in semiconductive wafer 10; a second plurality of optical amplifiers $22_1$, $22_2$, ..., $22_N$ connects corresponding ones of the second plurality of waveguides to second cleaved face 24 formed in wafer 10. Cleaved faces 20 and 24 form the reflective surfaces defining the resonant cavity in which lasing action is supported.

Each optical amplifier comprises a doped section of waveguide with controllable optical transmissivity. Doping may be such that an appropriately configured semiconductor junction is defined in each optical amplifier. The doped section is optically active in that application of electrical energy to the doped section causes it to become transmissive to the flow of optical energy and provides some degree of gain to optical signals flowing through the doped section. When electrical bias current above a lasing threshold is applied, laser action begins. These doped sections of waveguide are substantially opaque to the transmission of light when there is no applied electrical stimulation. The electrically controlled doped sections thus may be considered to be optoelectronic gates with optical amplification capability. Each amplifier is thereby individually controllable and addressable The details of fabricating such sections in a semiconductor wafer such as wafer 10 shown in FIG. 1 are generally known in the art and thus are not described here.

A gate control circuit 25 selectively provides bias current to predetermined ones of the optical amplifiers to produce laser light at one of N discrete frequencies as indicated by output light beam 11 in FIG. 1.

Selective application of bias current to predetermined ones of the optical amplifiers in FIG. 1 defines certain wavelength selective optical pathways in the resonant cavity between cleaved faces 20 and 24 determined by the geometry of the waveguide grating region of the router. Application of bias current above a lasing threshold to the selected ones of the optical amplifiers will cause lasing action at a wavelength supported in the wavelength selective optical pathways. Those optical amplifiers which are not driven by any bias current remain opaque to the transmission of optical energy through them. As such they block transmission of light at other wavelengths.

Waveguide grating router 12 operates in such a way that an optical signal at frequency $F_1$ in waveguide $14_1$ is directed straight through router 12 to waveguide $16_1$ and vice versa. For an optical signal at frequency $F_2$, the router directs the optical signal from waveguide $14_1$ to waveguide $16_2$ and vice versa. In general, an optical signal having a frequency $F_i$ appearing on waveguide $14_1$ and flowing toward the device 12 is directed to a waveguide $16_i$ by the waveguide grating router. Similarly, an optical signal having a frequency $F_i$ appearing on a waveguide $16_i$ and flowing toward the waveguide grating router 12 is directed to waveguide $14_1$. Additional details about operation and fabrication of router 12 are discussed in U.S. Pat. Nos. 5,002,350, 5,136,671, and 5,243,672, all issued to C. Dragone. It will be apparent to those persons skilled in the art that waveguides 14 serve as extensions of their corresponding waveguides in router 12, namely, waveguides 26. Similarly, waveguides 16 serve as extensions of the corresponding waveguides 38 in router 12.

The edges of the wafer at the ends of the two sets of optical amplifiers are cleaved to form reflective surfaces define a tunable resonant cavity between them. Amplifiers on one side of waveguide grating router 12 are used as electronically controllable transmission gates opened by application of a bias current. When these gates are biased by a current of 10 to 20 mA, for example, they become optically transparent and provide some gain depending on the level of the bias current with respect to the lasing threshold current value. On the other hand, the gates are highly lossy and suppress optical transmission when the applied bias current is zero.

In normal operation, only one optical amplifier from the plurality on one side of router 12 is biased so that it is optically transmissive. The remaining optical amplifiers of the plurality on the same side are usually unbiased. On the opposite side of waveguide grating router 12, one of the optical amplifiers in that plurality is also biased above a lasing threshold. The remaining amplifiers on that side are then unbiased in order to absorb any light reaching them. The pair of biased (active) optical amplifiers then defines a particular pathway through the router which produces an optical signal at a specific wavelength associated with that pathway.

Application of bias currents to the optical amplifiers in this manner defines a transparent pathway within the resonant cavity for lasing action. Along this pathway, stationary waves can be sustained for wavelengths (frequencies) within a passband associated with the pathway. Wavelengths outside this passband are associated with the other pathways and are therefore suppressed by the lossy unbiased optical amplifiers. Lasing occurs at the Fabry-Perot mode whose wavelength is nearest the passband maximum. Adjacent Fabry-Perot modes are suppressed by passband selectivity which can be adjusted by appropriate design of the router.

For the N×N waveguide grating router of FIG. 1, there are N passbands having a bandwidth ΔF and repeated periodically with a free spectral range (FSR) period NΔF. Assuming that the gain of the active semiconductive medium peaks sufficiently over one of these FSRs, N lasing wavelengths can be obtained in the free spectral range by appropriate activation of selected optical amplifiers in the wafer 10. Wavelengths outside this free spectral range are suppressed by gain discrimination. Tuning is achieved at discrete wavelengths separated by intervals ΔF over a tuning range NΔF. In addition, combinations of lasing frequencies can be obtained by activating more than one amplifier section on one side of router 12.

Described below are several examples illustrating tuning of the laser in FIG. 1 to one of a plurality of discrete optical frequencies. If it is desired that the laser of FIG. 1 produce optical energy at a frequency $F_1$, bias current is applied to optical amplifier $18_1$ and optical amplifier $22_1$. When the total gain from the two optical amplifiers is sufficient to overcome the total optical loss in the cavity, lasing is sustained at the wavelength determined by the path through the router. The minimum current required to sustain lasing is commonly called the threshold current.

An optically transmissive path is thereby defined between the reflective surfaces 20 and 24. This path comprises optical amplifier $18_1$, waveguide $14_1$, waveguide grating router 12, waveguide $16_1$, and optical amplifier $22_1$. An optical standing wave is formed in the resonant cavity at frequency $F_1$ and laser light at that desired frequency is output by the integrated device of FIG. 1 as shown by output optical beam 11. In this case, surface 20 may be partially transmissive and surface 24 may be totally reflective.

Similarly, if it is desired that the laser of FIG. 1 produce optical energy at a frequency $F_2$, bias current is applied to optical amplifier $18_1$ and optical amplifier $22_2$. Bias current applied to optical amplifier $22_2$ is above the lasing threshold for the semiconductor material. An optically transmissive path is thereby defined in the resonant cavity. The path comprises optical amplifier $18_1$, waveguide $14_1$, waveguide grating router 12, waveguide $16_1$, and optical amplifier $22_2$. An optical standing wave is created between the surfaces 20 and 24 at the frequency $F_2$ and laser light at that frequency is output by the device of FIG. 1 as shown by output optical beam 11.

Optical energy at frequencies $F_3$ to $F_N$ may be produced by activating optical amplifiers $22_3$ to $23_N$, respectively, instead of activating the optical amplifiers $22_1$ or $22_2$. The output frequency produced by the laser in FIG. 1 may be changed rapidly by switching the applied bias current from one optical amplifier to another in some desired order.

FIG. 2 shows the pertinent details in simplified form of an exemplary of a waveguide grating router device 12 employed in FIG. 1. The waveguide grating router contains a plurality of input waveguides 26 connected to first free space region 28. A plurality of interconnecting waveguides 30 extends from the free space region 28 to optical grating waveguide region 32. Optical grating waveguide region 32 comprises a plurality of unequal length waveguides for providing a predetermined amount of path length difference between interconnecting waveguides 30 and a corresponding plurality of interconnecting waveguides 34 connected to second free space region 36. Second free space region 36 is connected to a plurality of output waveguides 38.

Waveguides 26 and 38 serve as the input/output ports for the router. Stub waveguides 27, 29, 35, and 37 provide no input or output for the router and merely act to improve optical power transfer to the extremity waveguides in the pluralities of waveguides 26, 30, 34, and 38.

Waveguides 26 and waveguides 38 are all within the central Brillouin zone of the grating, which is known as the field of view for the grating. The input and output waveguides receive first order diffraction optical energy within the router from the grating waveguide region.

Angular opening $2\gamma$ of the central Brillouin zone is given by the following expression: $k \cdot a \cdot \sin\gamma = \pi$, where $k$ equals $2\pi/\lambda$, $a$ equals the spacing of the grating waveguides at the surface of the free space region in the router, and $\lambda$ is the optical signal wavelength. Similarly, the angle $\theta$ of the first order diffraction is defined as $K \cdot a \cdot \sin v, = \phi |\phi| < \pi$, where $\phi$ is the phase difference of the optical signals between neighboring grating waveguides. Angle $\theta$ is measured with respect to center axis 200 for the free space region. Accordingly, the angle of the second order diffraction $v'$, which is also measured with respect to center axis 200 of the free space region, is computed as $\theta - 2\gamma$ for $\theta > 0$ and as $\theta + 2\gamma$ for $\theta < 0$. The longitudinal axis of the waveguide for capturing the second order diffraction optical energy is disposed to intersect the surface of the free space region at angle $v'$ from center axis 200. The frequency of the light captured by the latter waveguide is substantially identical to the frequency of the first order diffracted light captured by the waveguide whose longitudinal axis intersects the same free space region at angle $\theta$.

These waveguide grating routers operate as multiplexers and demultiplexers of optical frequencies. The details of their construction and operation are more fully described in the U.S. Pat. Nos. referred to above, the entire contents of which are hereby incorporated by reference into this application. In the case of waveguide grating router 12 in FIG. 1, input waveguides 26 are connected to the waveguides $14_1, 14_2, \ldots, 14_N$, respectively and the plurality of output waveguides 38 are connected to the waveguides $16_1, 16_2, \ldots, 16_N$.

In the prior art waveguide grating router shown in FIG. 2, N waveguides 26 are disposed along an outer surface first free space region 28 to collect the first order diffraction light associated with each of the N different wavelengths coupled by the router. There is no higher order diffracted light coupled out of the free space region and delivered to the output port of the waveguide grating router. In general, since the higher order diffracted light at one of the N wavelengths is considered within the loss budget of the router, the design of waveguide grating routers has been customized to reduce the amount of light within the free space region propagating in second and higher order diffraction modes.

In the present invention, the primary waveguides (e.g., waveguides 26 and 38) associated with first order diffracted light from the free space regions of the waveguide grating router are coupled to the output or input ports of the router together with a secondary waveguide which serves as an output waveguide. The output waveguide is constructed within the waveguide grating router to capture second order diffraction light at the desired wavelength from one free space region of the router and then couple that captured light to the router output.

FIG. 3 shows a simplified diagram of a modified portion of the waveguide grating router having a secondary waveguide for capturing second order diffraction optical energy realized in accordance with the principles of the present invention. The portion of the waveguide grating router shown in FIG. 3 is the first free space region 28 and waveguide connections to one side of that free space region. Several primary waveguides 26 are shown as well as secondary waveguide 261. Each waveguide terminates at specific locations on router 12 which connect to waveguides $14_i$ and 15 (shown in FIG. 4). For example, primary waveguide $26_1$ terminates at the location on router 12 to which waveguide $14_1$ is connected. Similarly, primary waveguide $26_2$ terminates at the location on router 12 to which waveguide $14_2$ is connected. Waveguide 15 is connected to router 12 at the location where secondary waveguide 261 connects. It is the latter waveguide, secondary waveguide 261, which is designed to capture second order diffracted light from free space region 28 and deliver that captured light to the output of the router. Assuming that the first order diffraction light at the desired wavelength is captured by primary waveguide $26_1$, the second order diffraction light at the desired wavelength is captured by secondary waveguide 261. Primary waveguide $26_1$ is associated directly with secondary waveguide 261 because both waveguides carry light at the same wavelength.

The spacing between grating waveguides 30 at the free space region 28 is a. Grating waveguides 30 have their center axes directed to focal point 204 for curved surface 282. Primary waveguides 26 and secondary waveguide 261 have their axes directed to center of curvature 205 for curved surface 281. Waveguide $26_1$ is displaced from the central axis of the free space region by an angle $\theta$. In order to capture the second order diffracted light at the desired wavelength, that is, at the same wavelength found in waveguide $26_1$, waveguide 261 is displaced along the output surface of the free space region by an angle $2\gamma$ measured from the waveguide $26_1$.

Figure 4:
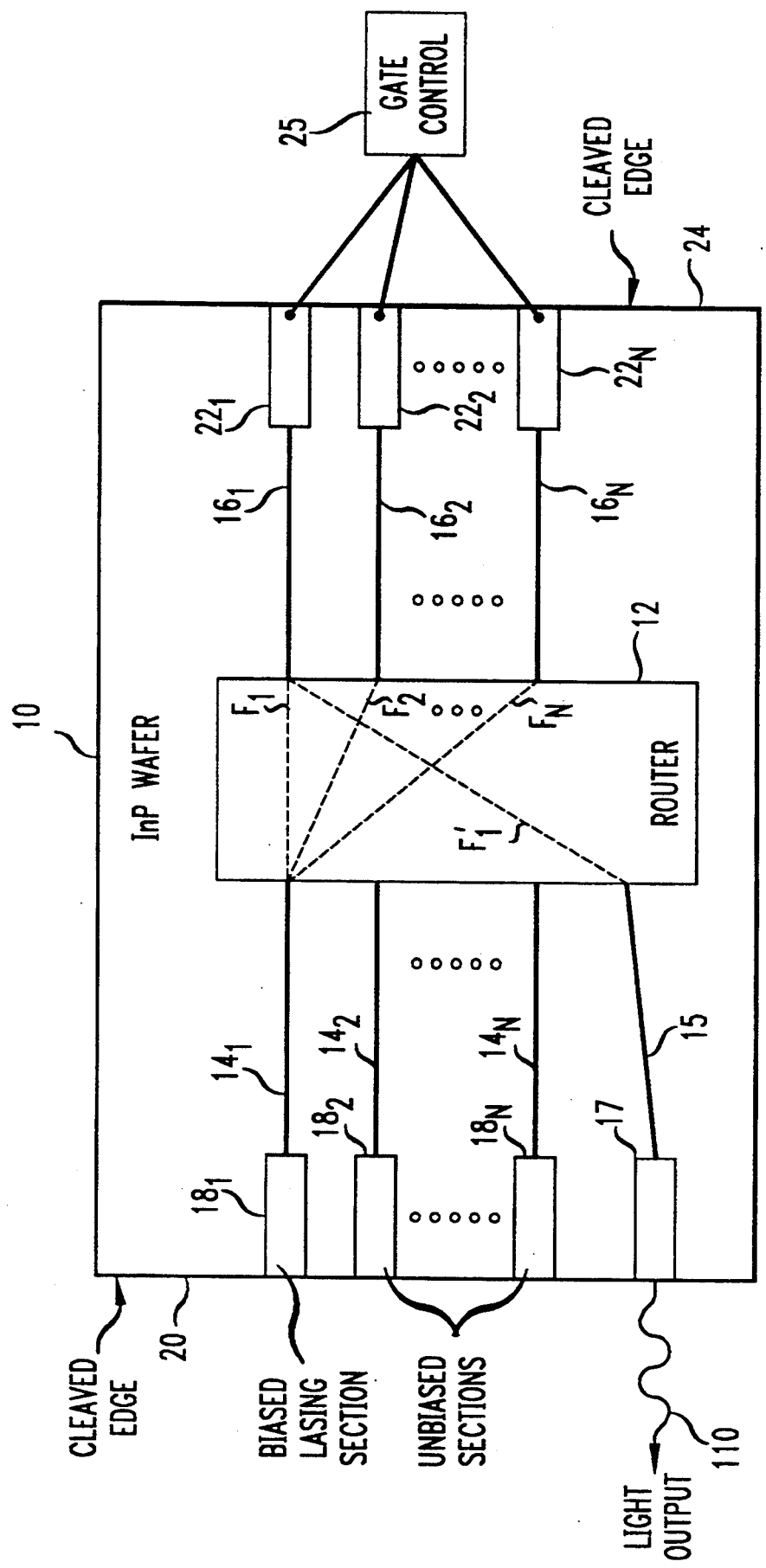
FIG. 4 shows a simplified schematic drawing of a tunable laser incorporating a waveguide grating router realized in accordance with the principles of the present invention.

FIG. 4 shows a simplified schematic drawing of a tunable laser incorporating a modified waveguide grating router realized in accordance with the principles of the present invention and partially shown in FIG. 3. Router 12 as modified according to FIG. 3 captures the second order diffraction lasing optical energy $F_1'$ at frequency $F_1$ and delivers it to waveguide 15. Waveguide 15 is an output waveguide for the tunable laser in that it supplies the light output beam 110 to the laser output. Element 17 is an optional amplifier similar to waveguide optical amplifiers 18 and 22 for amplifying the light output beam of the laser. Tuning of the laser is accomplished, as described above, by pumping an appropriate pair of optical amplifiers with the bias current.

In this configuration, the intra-cavity loss of the laser is not increased. Second order diffraction optical power which had previously been discarded is now being used for output coupling. With high reflectivity mirrors in place on the primary waveguides, first order diffraction optical energy is returned to the resonant cavity for lasing rather than output coupling thereby increasing the laser efficiently.

Figure 5:
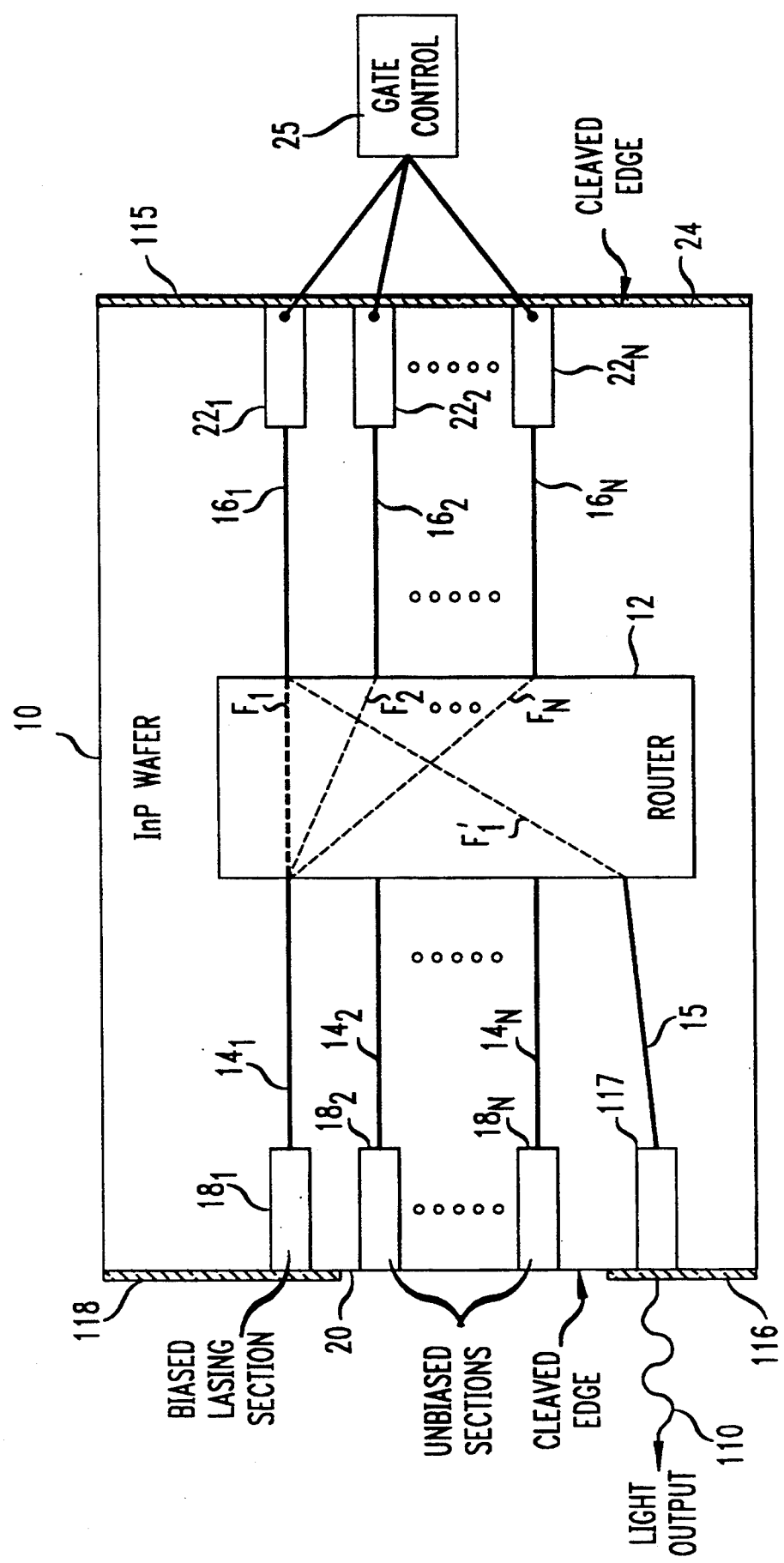
FIG. 5 shows an alternative embodiment of the tunable laser of FIG. 4.

FIG. 5 shows an alternative embodiment of the tunable laser of FIG. 4. In this embodiment, optional enhancements are made to the laser shown in FIG. 4. For example, the laser is shown with high reflectivity layers 115 and 118 for the resonant cavity, anti-reflective layer 116 for the laser output port, and integrated on-chip modulator 117. It is contemplated that one or all of these improvements can be incorporated into the present tunable laser.

High reflectivity layers 115 and 118 such as multilayer dielectric stack mirror coatings are applied to the reflective surfaces of the tunable laser. These layers are not intended to extend over that portion of the reflective surface through which the desired second order diffraction optical energy exits the laser. Instead, the highly reflective layers extend over the portions of the reflective surfaces through which first order diffraction light could exit the laser. It is contemplated that reflectivities significantly higher than 30% and preferably near 100% can be used for layers 115 and 118.

Anti-reflective layer 116 is applied over that portion of the reflective surface through which the desired second order diffraction light exits the laser. This layer is realized in one embodiment by a multilayer dielectric stack mirror. Reflectivity for the anti-reflective layer is contemplated to be less that 10% and preferably on the order of 1%.

Element 117 can be an integrated on-chip optical modulator for directly modulating the laser output beam before it leaves tunable laser 10. Of course, element 117 could also include any combination of optical amplifier, optical polarization controller, and optical modulator.

While the optical amplifiers are shown as the connections between the waveguides 14, 15 and 16 and their respective resonant cavity surfaces in the laser, it is contemplated that the amplifiers or other elements such as a modulator can be formed at any point along their respective waveguide as long as the angle or spacing between primary and secondary waveguides equals $2\gamma$. The angle $\gamma$ is called the angle of the first Brillouin zone since it limits the zone of first order diffraction.

Waveguides in the router and laser described above are desirably single mode waveguides. It should be noted that one or more of these waveguides can be fabricated to operate as multimode waveguides.

It is understood that, while the Group III–V material system InGaAsP/InP is described above for fabricating the tunable laser, other material combinations may be selected from other semiconductor Group III–V systems such as GaAs/InGaAs, InGaAs/InGaAlAs, InGaAs/InAlAs, GaAs/AlAs, GaAsSb/GaAlAsSb and AlGaAs/GaAs to realize the tunable laser. In these semiconductor systems, the layers may be lattice-matched to suitable GaAs or InP substrates. Mismatching is also contemplated wherein strained layers are grown over the substrate material. Finally, extension of the device structures to semiconductor compounds in Group II–VI and Group IV is also contemplated.

In an example from experimental practice, the tunable laser has been realized with an 8×8 waveguide grating router operating at a fundamental channel wavelength of 1562 nm. The interchannel wavelength spacing is 1.62 nm with an output channel power close to 0 dBm. Losses from the router and output coupling is are 8 dB and 4 dB, respectively. The integrated modulator in the secondary output waveguide has been designed for 2.5 Gbps operation.

While a presently preferred embodiment of the invention employs amplifiers in waveguides on both sides of the resonant cavity, it is contemplated that the router and waveguides can be redesigned to employ amplifiers on a single side of the cavity. For example, amplifiers 18 can be eliminated from the apparatus shown in FIG. 4 provided that only one waveguide 14 is terminated on the reflective surface. Since the remaining waveguides 14 are not terminated on the reflective surface, those waveguides are not capable of providing optical feedback to the cavity. In such a modified laser, it is only necessary to activate one amplifier for generating a laser output beam at a desired wavelength.

I claim:

1. A laser tunable to at least one of N separate wavelengths including, first and second reflective surfaces positioned opposite each other for defining a resonant optical cavity there between a waveguide grating router disposed within said resonant optical cavity having at least one primary waveguide and one secondary waveguide, both on one side of said router, and N input waveguides on an opposite side of said router, said primary waveguide and said N input waveguides for capturing first order diffraction optical energy from corresponding free space regions in said router, and said secondary waveguide for capturing second order diffraction optical energy at the at least one wavelength, the wavelength of optical energy in said primary and secondary waveguides being substantially identical, a plurality of selectively controllable optical amplifiers, each amplifier in series with a corresponding waveguide from the group consisting of said N input waveguides and said at least one primary is waveguide, and control means for pumping at least a pair of said selectively controllable optical amplifiers to create a wavelength selective pathway through the router for laser operation at the at least one wavelength said wavelength selective pathway optically connecting both reflective surfaces.

2. The laser as defined in claim 1 further comprising an optical modulator in the secondary waveguide.

3. The laser as defined in claim 2 wherein the first and second reflective surfaces are highly reflective to reflect almost all optical energy impinging thereon and wherein the reflectivity of said first reflective surface is significantly reduced to make that surface anti-reflective substantially where the light from the secondary waveguide impinges on the first reflective surface.

4. The laser as defined in claim 1 wherein the reflectivity of said first reflective surface is significantly reduced to make that surface anti-reflective substantially where the light from the secondary waveguide impinges on the first reflective surface.

5. The laser as defined in claim 1 further including a selectively controllable optical amplifier in series with said secondary waveguide and said control means for pumping said amplifier in said secondary waveguide.

6. The laser as defined in claim 5 wherein the first and second reflective surfaces are highly reflective to reflect almost all optical energy impinging thereon and wherein the reflectivity of said first reflective surface is significantly reduced to make that surface anti-reflective substantially where the light from the secondary waveguide impinges on the first reflective surface.

7. A tunable laser comprising, a resonant laser cavity defined by two reflective elements in an actively doped semiconductor wafer, a frequency routing device formed in the cavity comprising a plurality of controllable frequency selective pathways optically connecting the reflective elements such that selective gating of one or more of the frequency selective pathways causes selected one or more laser frequencies to be supported in the laser cavity to provide tunability of the laser, and a secondary pathway related to one of the frequency selective pathways for capturing second order diffraction optical energy at the selected one or more frequencies, said secondary pathway optically connected to at least one of the reflective elements.

8. The tunable laser as defined in claim 7 further comprising a plurality of optical amplifiers in the frequency selective pathways.

9. The tunable laser as defined in claim 8 further comprising an optical amplifier in said secondary pathway.

10. The tunable laser as defined in claim 8 further comprising an optical modulator in the secondary pathway.

11. The tunable laser as defined in claim 8 further comprising a control circuit for selectively activating the optical amplifiers to define a predetermined frequency selective pathway in the laser cavity and to create lasing action in the predetermined frequency selective pathway.

12. The tunable laser as defined in claim 11 further comprising an optical amplifier in said secondary pathway and wherein the control circuit activates the optical amplifier in the secondary pathway.

13. The tunable laser as defined in claim 12 wherein the first and second reflective elements are highly reflective to reflect almost all optical energy impinging thereon and wherein the reflectivity of said first reflective element is significantly reduced to make that element anti-reflective substantially where the light from the secondary pathway impinges on the first reflective element.

14. A laser tunable to at least one of N separate wavelengths including, first and second reflective surfaces positioned opposite each other for defining a resonant optical cavity there between a waveguide grating router disposed within said resonant optical cavity having at least one primary waveguide and one secondary waveguide, both on one side of said router, and N input waveguides on an opposite side of said router, said primary waveguide and said N input waveguides for capturing first order diffraction optical energy from corresponding free space regions in said router, and said secondary waveguide for capturing second order diffraction optical energy at the at least one wavelength, the wavelength of optical energy in said primary and secondary waveguides being substantially identical, a plurality of selectively controllable optical amplifiers, each amplifier in series with a corresponding waveguide from said N input waveguides, and control means for pumping at least one of said selectively controllable optical amplifiers to create a wavelength selective pathway through the router for laser operation at the at least one wavelength said wavelength selective pathway optically connecting both reflective surfaces.

15. The laser as defined in claim 14 further comprising an optical modulator in the secondary waveguide.

16. The laser as defined in claim 15 wherein the first and second reflective surfaces are highly reflective to reflect almost all optical energy impinging thereon and wherein the reflectivity of said first reflective surface is significantly reduced to make that surface anti-reflective substantially where the light from the secondary waveguide impinges on the first reflective surface.

17. The laser as defined in claim 14 wherein the reflectivity of said first reflective surface is significantly reduced to make that surface anti-reflective substantially where the light from the secondary waveguide impinges on the first reflective surface.

18. The laser as defined in claim 14 further including a selectively controllable optical amplifier in series with said secondary waveguide and said control means for pumping said amplifier in said secondary waveguide.

19. The laser as defined in claim 18 wherein the first and second reflective surfaces are highly reflective to reflect almost all optical energy impinging thereon and wherein the reflectivity of said first reflective surface is significantly reduced to make that surface anti-reflective substantially where the light from the secondary waveguide impinges on the first reflective surface.

* * * * *